(12) United States Patent
De Wit

(10) Patent No.: US 8,045,028 B1
(45) Date of Patent: Oct. 25, 2011

(54) SIX TRANSISTOR (6T) PIXEL ARCHITECTURE

(75) Inventor: Yannick De Wit, Wilrijk (BE)

(73) Assignee: On Semiconductor Trading Ltd., Hamilton (BM)

( * ) Notice: Subject to any disclaimer, the term of this patent is extended or adjusted under 35 U.S.C. 154(b) by 553 days.

(21) Appl. No.: 12/148,915

(22) Filed: Apr. 22, 2008

Related U.S. Application Data

(60) Provisional application No. 60/926,002, filed on Apr. 23, 2007.

(51) Int. Cl.
*H04N 3/14* (2006.01)
*H04N 5/335* (2006.01)
*H01L 31/062* (2006.01)
*H01L 31/113* (2006.01)
*H01L 27/00* (2006.01)

(52) U.S. Cl. ............... 348/302; 257/290; 250/208.1
(58) Field of Classification Search .......... 348/300–302, 348/308
See application file for complete search history.

(56) References Cited

U.S. PATENT DOCUMENTS

| | | | |
|---|---|---|---|
| 5,128,534 A | 7/1992 | Wyles et al. | |
| 5,461,425 A | 10/1995 | Fowler et al. | |
| 5,990,948 A | 11/1999 | Sugiki | |
| 6,166,367 A | 12/2000 | Cho | |
| 6,225,670 B1 | 5/2001 | Dierickx | |
| 6,545,303 B1 | 4/2003 | Scheffer | |
| 6,812,539 B1 | 11/2004 | Rhodes | |
| 6,836,291 B1 | 12/2004 | Nakamura et al. | |
| 7,432,540 B2 * | 10/2008 | McKee | 257/225 |
| 7,750,958 B1 * | 7/2010 | Dierickx | 348/294 |
| 2003/0011694 A1 | 1/2003 | Dierickx | |
| 2004/0235215 A1 | 11/2004 | Komori | |
| 2005/0088553 A1 | 4/2005 | Kuwazawa | |
| 2005/0099517 A1 | 5/2005 | Kuwazawa | |
| 2006/0243887 A1 * | 11/2006 | Boemler | 250/208.1 |
| 2007/0029469 A1 * | 2/2007 | Rhodes | 250/214 R |

FOREIGN PATENT DOCUMENTS

WO    WO 99/30368    6/1999

OTHER PUBLICATIONS

Orly Yadid-Pecht et al., "A Random Access Photodiode Array for Intelligent Image Capture", IEEE Transactions on Electron Devices, vol. 38, No. 8, Aug. 1991, pp. 1772-1780.
J. Bogaets et al., "High-end CMOS Active Pixel Sensor for Hyperspectral Imaging", 2005 IEEE Workshop on Charge-Coupled Devices and Advanced Image Sensors, R11, pp. 39-43, Jun. 9-11, 2005, Karuizawa Prince Hotel, Karuizawa, Nagano, Japan.
Herman Witters, et al., "1024×1280 pixel dual shutter APS for industrial vision", Sensors and Camera Systems for Scientific, Industrial, and Digital Photography Applications IV, Proceedings of SPIE-IS&T Electronic Imaging, SPIE vol. 5017 (2003), pp. 19-23.
Recontres de Technologies Spatiales, "Systemes Imageurs a Haute Resolution (OT1), Développement d'un démonstrateur de détecteur APS <<snapshot>>", Toulouse 5 & 6 Octobre 2006, pp. 1-16.
Bart Dierickx et al., "NIR-enhanced image sensor using multiple epitaxial layers", Sensors and Camera Systems for Scientific, Industrial, and Digital Photography Applications V, Proceedings of, SPIE vol. 5301 (2004), pp. 205-212.

* cited by examiner

*Primary Examiner* — Kelly L Jerabek
(74) *Attorney, Agent, or Firm* — Robert F. Hightower

(57) ABSTRACT

A pixel having a high voltage DC supply being replaced by a pulsed signal high voltage supply that is coupled to one of the plates of a memory capacitor in the pixel.

20 Claims, 14 Drawing Sheets

SIX TRANSISTOR (6T) PIXEL ARCHITECTURE

RELATED APPLICATION

This application claims the benefit of U.S. Provisional Application No. 60/926,002, filed Apr. 23, 2007, the entire contents of which are hereby incorporated by reference herein.

TECHNICAL FIELD

The present invention relates generally to a pixel structure and, more particularly, to a six transistor (6T) pixel structure.

BACKGROUND

Solid-state image sensors have found widespread use in camera systems. The solid-state imager sensors in some camera systems are composed of a matrix of photosensitive elements in series with switching and amplifying elements. The photosensitive sensitive elements may be, for example, photoreceptors, photo-diodes, phototransistors, charge-coupled device (CCD) gate, or alike. Each photosensitive element receives an image of a portion of a scene being imaged. A photosensitive element along with its accompanying electronics is called a picture element or pixel. The image obtaining photosensitive elements produce an electrical signal indicative of the light intensity of the image. The electrical signal of a photosensitive element is typically a current, which is proportional to the amount of electromagnetic radiation (light) falling onto that photosensitive element.

Of the image sensors implemented in a complementary metal-oxide-semiconductor (CMOS)- or MOS-technology, image sensors with passive pixels and image sensors with active pixels are distinguished. The difference between these two types of pixel structures is that an active pixel amplifies the charge that is collected on its photosensitive element. A passive pixel does not perform signal amplification and requires a charge sensitive amplifier that is not integrated in the pixel.

FIG. 1A illustrates one embodiment of a conventional pixel structure used within a synchronous shutter image sensor. A synchronous shutter image sensor is used to detect the signal of all the pixels within the array at (approximately) the same time. This is in contrast to an asynchronous shutter image sensor that may be implemented with a 3T (three transistor) or 4T (four transistor) pixel structure that does not include a sample and hold stage. Such an asynchronous shutter image sensor outputs the state of a pixel at the moment of read out. This gives movement artifacts because every pixel in the array is not sensing a scene at the same moment.

The pixel structure of FIG. 1A that is used in a synchronous shutter image sensor includes a light detecting stage and a sample and hold stage. The light detecting stage includes a photodiode, a reset transistor, and a reset buffer (e.g., a unity gain amplifier). The sample and hold stage includes a sample transistor, one or more memory capacitors (represented by the capacitor Cmem in FIG. 1A), a sample buffer and a multiplexer, i.e., switch or row select transistor coupled to a column output of the pixel array.

FIG. 1B illustrates one conventional 6 transistor (6T) pixel circuit configuration of the synchronous pixel of FIG. 1A. The reset transistor of the light detecting stage is used to reset the pixel to a high value, and then the voltage on the gate of the source follower transistor M1 starts dropping due to the photocurrent generated in the photodiode. The source follower transistor M1 operates as a unity gain amplifier to buffer the signal from the photodiode. The sample and hold (S&H) stage of FIG. 1B "sample" loads the voltage signal of source follower transistor M1, through the sample transistor, on the memory capacitor (Cmem). The voltage signal from the source follower transistor M1 will remain on the memory capacitor when the sample transistor is turned off. The memory capacitor should be pre-charged to a starting voltage before sampling occurs. The pre-charge transistor serves to pre-charge the voltage on Cmem to a low voltage level upon application of the pre-charge pulse to the gate of the pre-charge transistor, with the source of the pre-charge transistor being tied to ground (GND).

During the frame overhead time, the signal is sampled on the memory capacitor which can be a POD (poly over diffusion), a poly poly capacitor, a MIM (metal insulator metal) capacitor or a transistor which is properly biased to form a stable capacitor during sampling. Due to the second source follower's (M2) threshold voltage (Vt) loss, it is required to pulse Vmem to increase signal swing due to capacitive coupling. During readout, Vmem is pulsed a Vt higher compared to its value during sampling which brings the total pixel swing to the same range as a 3T pixel. As shown in FIG. 1B, a metal line, separate from the supply line VDD, is used to pulse Vmem. The use of a separate metal line may cause a decrease in the fill factor of the pixel (i.e., the ratio of the light sensitive area of the pixel to its total area). In addition, during manufacturing of pixel arrays, the use of this separate metal line for Vmem may cause shorts between Vmem and the supply line VDD, the select line, reset line, or any other signal in the pixel. In the case of Vmem being shorted with the supply line VDD, Vmem becomes the same voltage as VDD, for example, 2.5 volts, and then Vmem can't be pulled up for the sampling and read out of the pixels. The short between Vmem and the supply line results in inoperable rows/columns, which consequently degrades yield during manufacturing of pixel arrays.

FIG. 2 illustrates a timing diagram of the pixel structure of FIG. 1B. The voltage Vprecharge represents the signal applied to the pre-charge transistor to erase the previous sampled value. The voltage Vprecharge may be applied right before the sampling period, right before and extending through the beginning of the sampling period, or only during the beginning of the sampling period to erase the previous sampled value. The voltage Vsample represents the signal applied to the sample transistor and is high during sampling. The voltage Vreset represents the signal applied to the reset transistor and is high during reset. The voltage Vmem is low during sampling and high during reset operation.

BRIEF DESCRIPTION OF THE DRAWINGS

The present invention is illustrated by way of example, and not by way of limitation, in the figures of the accompanying drawings.

DETAILED DESCRIPTION

Figure 1A:
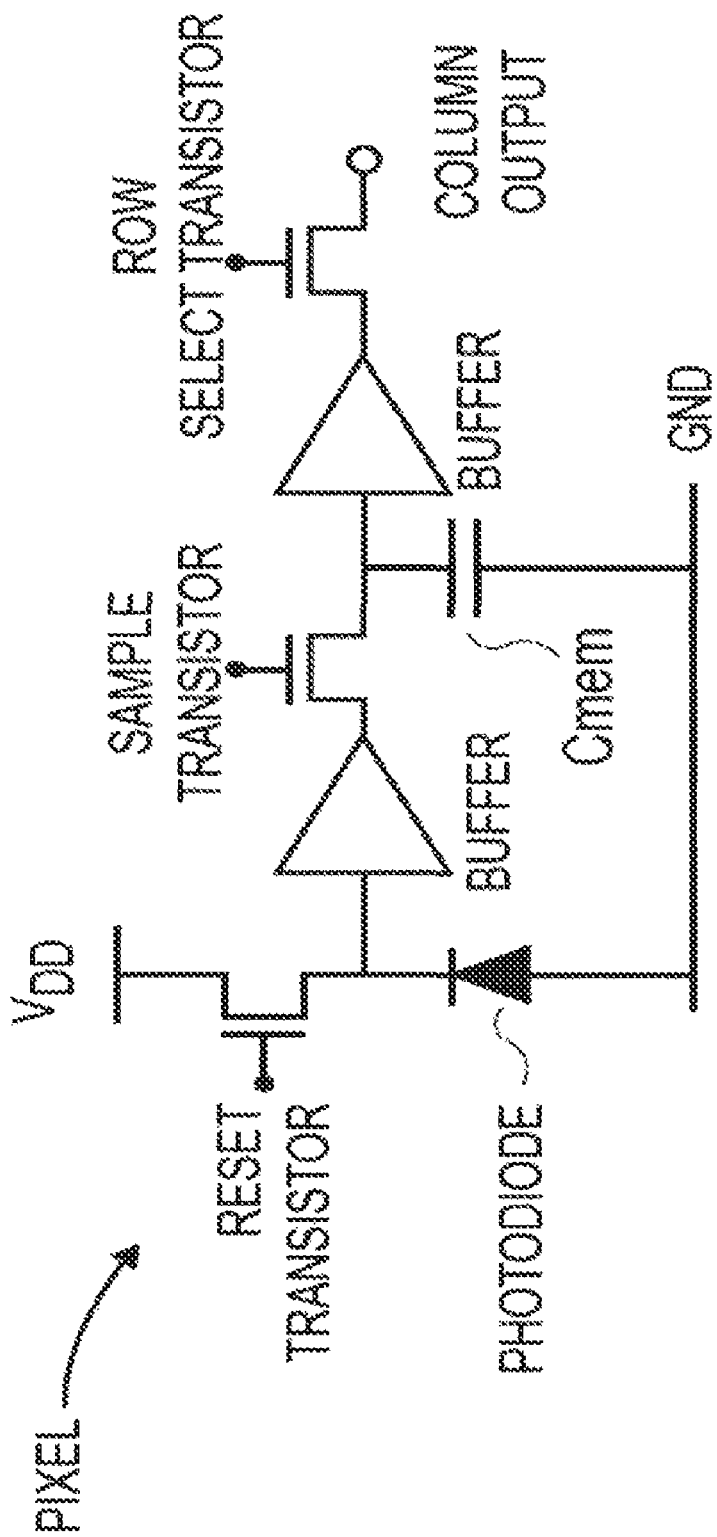
FIG. 1A illustrates a conventional 6T pixel structure.

Described herein is a six transistor (6T) pixel architecture. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of a method and an apparatus are described to a pixel having a controllable high voltage supply node, in place of a high voltage supply node and a separate control line supplied to a memory capacitor of the pixel, coupled to a plate of the memory capacitor. In one embodiment, the pixel power supply is connected to one of the plates of the memory capacitor. This may reduce the number of metal lines used in the pixel, which increases the fill factor and reduces the possibility of shorts between the high voltage supply line and the control line to the memory capacitor. The controllable high voltage supply line may be pulsed to various voltage levels during reset, readout, and sampling of the pixel. For example, during reset and sampling, the controllable high voltage supply node may be set to the same voltage as indicated by Vmem described above. However, during readout the controllable high voltage supply node may be pulsed higher to compensate for the threshold voltage (Vt) which is lost due the second source follower transistor (as compared to a 3T architecture). This allows the second source follower transistor's drain voltage to be higher, leading to a higher current to drive the column load of the pixel. Having a higher current to drive the column load may reduce the row overhead time (ROT).

The embodiments described herein may have a greater signal swing in the hard reset mode than conventional architectures. The increase in signal swing is caused by the parasitic coupling between the drain and gate of the first source follower transistor, which compensates for the loss caused by the capacitive coupling between the gate and source of the reset transistor. The embodiments described herein may be especially useful for small photodiode capacitances, such as less than approximately 5 femto farads, which otherwise suffer from low swing caused by capacitive coupling with the reset pulse. It should be noted that although the embodiments described herein are described with respect to a 6T pixel, alternatively, the embodiments described herein may be implemented in other types of pixel architectures than the 6T pixel architecture.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1B:
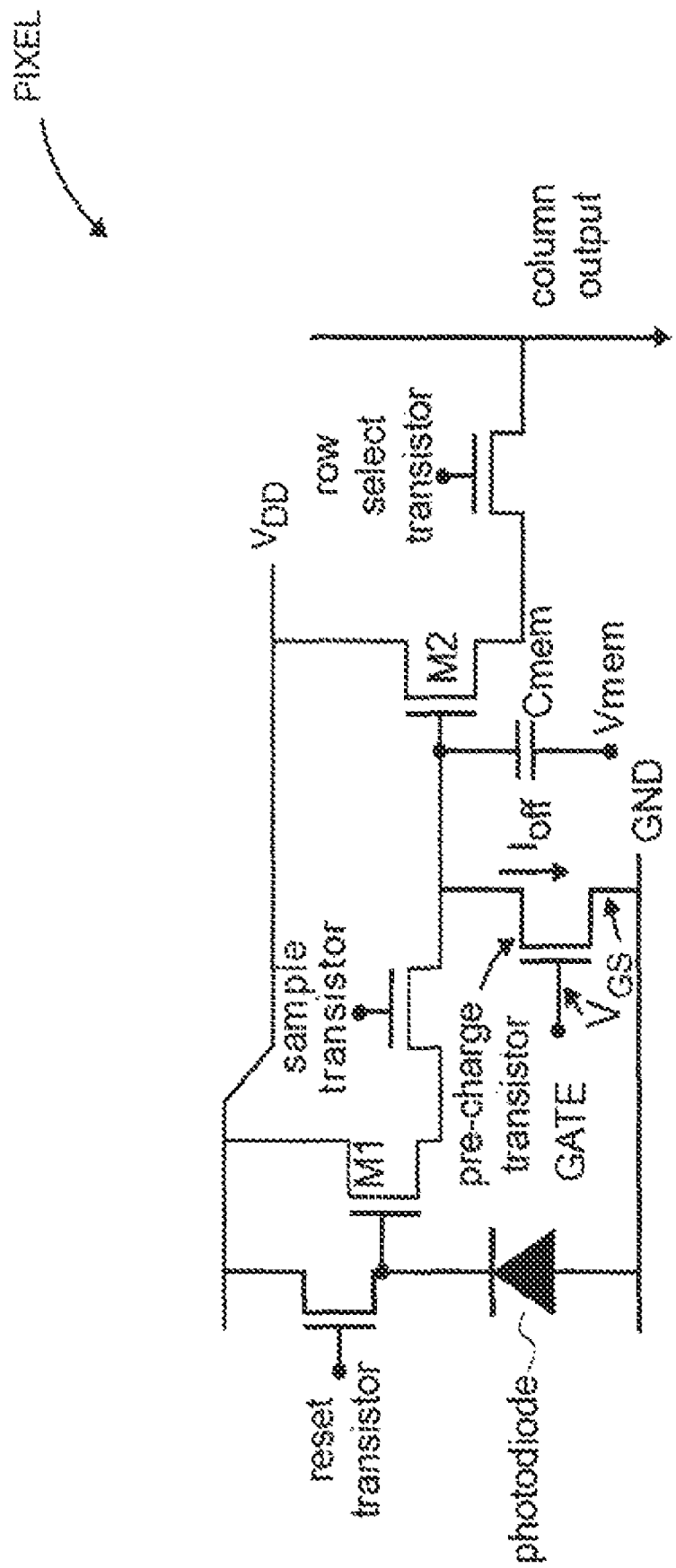
FIG. 1B provides a more detailed illustration of a conventional 6T pixel configuration.
Figure 3A:
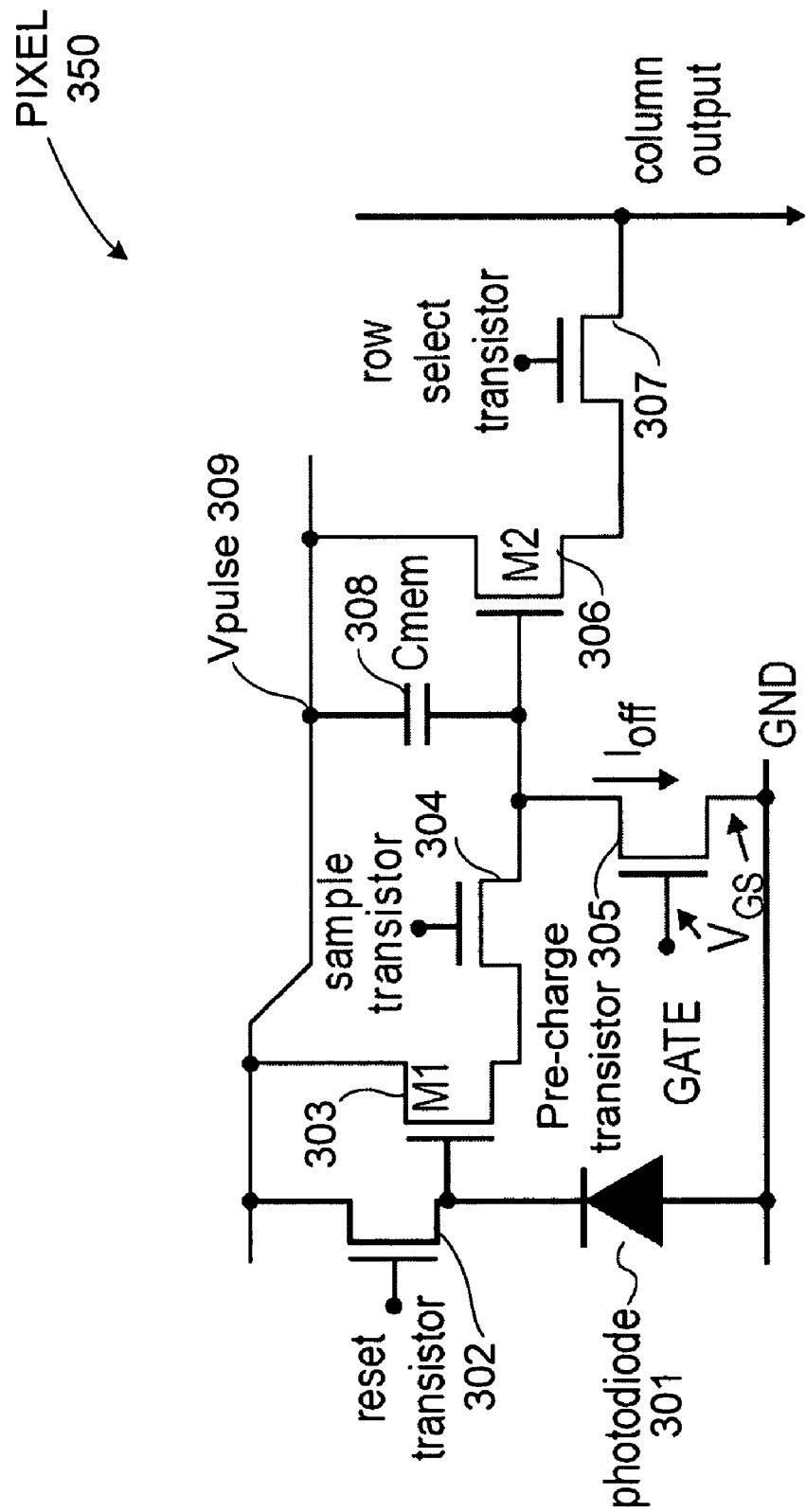
FIG. 3A illustrates one embodiment of a pixel having a controllable high voltage supply node coupled to a memory capacitor in the pixel.

FIG. 3A illustrates one embodiment of a pixel having its high voltage supply node coupled to a memory capacitor (Cmem) 308 in the pixel. In this embodiment, the pixel 350 is a 6 transistor (6T) pixel. The 6T pixel 350 in FIG. 3A includes a photosensitive element, which may be a photodiode 301. The pixel 350 may also include a reset transistor 302, a first source follower transistor M1 303, a sample transistor 304, a pre-charge transistor 305, a second source follower transistor M2 306, a row select transistor 307, a memory capacitor 308, and a controllable high voltage supply node 309. The separate metal line used to pulse Vmem and the high voltage direct current (DC) supply node VDD of FIG. 1B are replaced by the controllable high voltage supply node 309, which receives a multi-level voltage signal, Vpulse signal (referred to herein as Vpulse 309). The controllable high voltage supply node 309 receives multiple voltage levels of Vpulse 309 during operation of the pixel 350. The controllable high voltage supply node 309 is coupled to the drains of the reset transistor 302, the first source follower transistor 303, and the second source follower transistor 306, as well as to one end (e.g., back plate) of the memory capacitor 308 (Cmem). The controllable high voltage supply node 309, unlike the supply node VDD of FIG. 1B, can be controlled to supply different voltage levels to the memory capacitor 308, and supply a high voltage to the drains of the reset transistor 302 and the source follower transistors 303 and 306. In one embodiment, the controllable high voltage supply node 309 receives two voltage levels of Vpulse 309 during operation of the pixel 350. In another embodiment, the controllable high voltage supply node 309 receives three voltage levels of Vpulse 309 during operation of the pixel 350.

One exemplary sequence of operation for the pixel of FIG. 3A is as follows: reset, integration, readout, reset, etc. During the reset period, the pixel 350 establishes a known baseline voltage. During the integration period, the pixel 350 establishes a voltage relative to the light incident on the pixel photodiode 301. During the readout period, the pixel 350 transfers the integration voltage (or a voltage from which the integration voltage may be derived) to an integration circuit (not shown) for processing. The integration circuit may sample the integration voltage at the end of an integration period or may sample and hold the integration voltage during the readout period. The pixel 350 is then hard reset, soft reset, or hard-soft reset. In general, a hard reset erases image lag in the pixel 350, but introduces more noise than a soft reset. A hard-soft reset combination reduces the noise from the hard reset, which reduces image lag in the pixel 350.

A pixel having such a structural configuration as illustrated in FIG. 3A requires no timing change from the timing of the conventional pixel structure when a transistor is not used for the memory capacitor 308 (Cmem). When a transistor is used for the memory capacitor 308 (Cmem), such a pixel structure requires a timing change compared to the traditional timing in hard reset mode or in hard-soft reset mode, but not for a soft reset operation, as described below with respect to FIGS. 4A-4D. As described below, when a transistor is used as the memory capacitor 308, proper biasing is required to form a channel in the transistor during sampling and readout. For this reason, it is required to have a timing change in the hard reset mode and the hard-soft reset mode compared to the timing in a conventional 6T pixel, as described below in FIGS. 4B and 4C. FIGS. 4B and 4C illustrate timing examples for both reset modes. It should be noted that alternative signal voltage values may be used.

In one embodiment, the photodiode 301 has an anode terminal coupled to ground and a cathode terminal coupled to the source terminal of reset transistor 302 and the gate terminal of the first source follower transistor M1 303. The reset transistor 302 has a drain terminal coupled to the controllable high voltage supply node 309. The first source follower transistor M1 303 and the second source follower transistor M2 306 also have drain terminals coupled to the controllable high voltage supply node 309. The pre-charge transistor 305 has a source terminal coupled to ground and a drain terminal coupled to the gate terminal of the second source follower transistor M2 306. The memory capacitor 308 has a first plate coupled to controllable high voltage supply node 309 and a second plate coupled to the gate terminal of the second source follower transistor M2 306. In one embodiment, the first plate is a back plate of the memory capacitor of the pixel. The sample transistor 304 is coupled between the source terminal of the first source follower transistor M1 303 and the other plate of the memory capacitor 308. The row select transistor 307 is coupled to the source terminal of the second source follower transistor M2 306 and an output signal line.

In one embodiment, where one of the plates of the memory capacitor 308 is coupled to the same controllable high voltage supply node 309 as the reset transistor 302, the first source follower transistor M1 303, and the second source follower transistor M2 306, there may be an increase in fill factor because a separate power supply for the memory capacitor is not required. The fill factor may be a measure of a ratio of the light sensitive area of the pixel to the total area of the pixel. Because the supply line VDD and the control signal node Vmem of FIG. 1B have been replaced with the controllable high voltage supply node 309, the pixel 350 has less conductive lines than the pixel of FIG. 1B. Also, the pixel yield may be directly improved because there is no possibility of shorts between separate power supply lines or signal lines which can cause bad rows or columns in a pixel array. The short between Vmem and VDD can be a great contributor to inoperable rows/columns in the pixel of FIG. 1B. In addition, because the controllable high voltage node 309 is also coupled to the drains of the reset transistor 302, the first and second source follower transistors 303 and 306, the signal swing of the pixel 350 increases, as compared to the signal swing of the pixel of FIG. 1B. The increased signal swing, for example, in the hard reset mode, may be due to the parasitic capacitance, as described below.

Figure 3B:
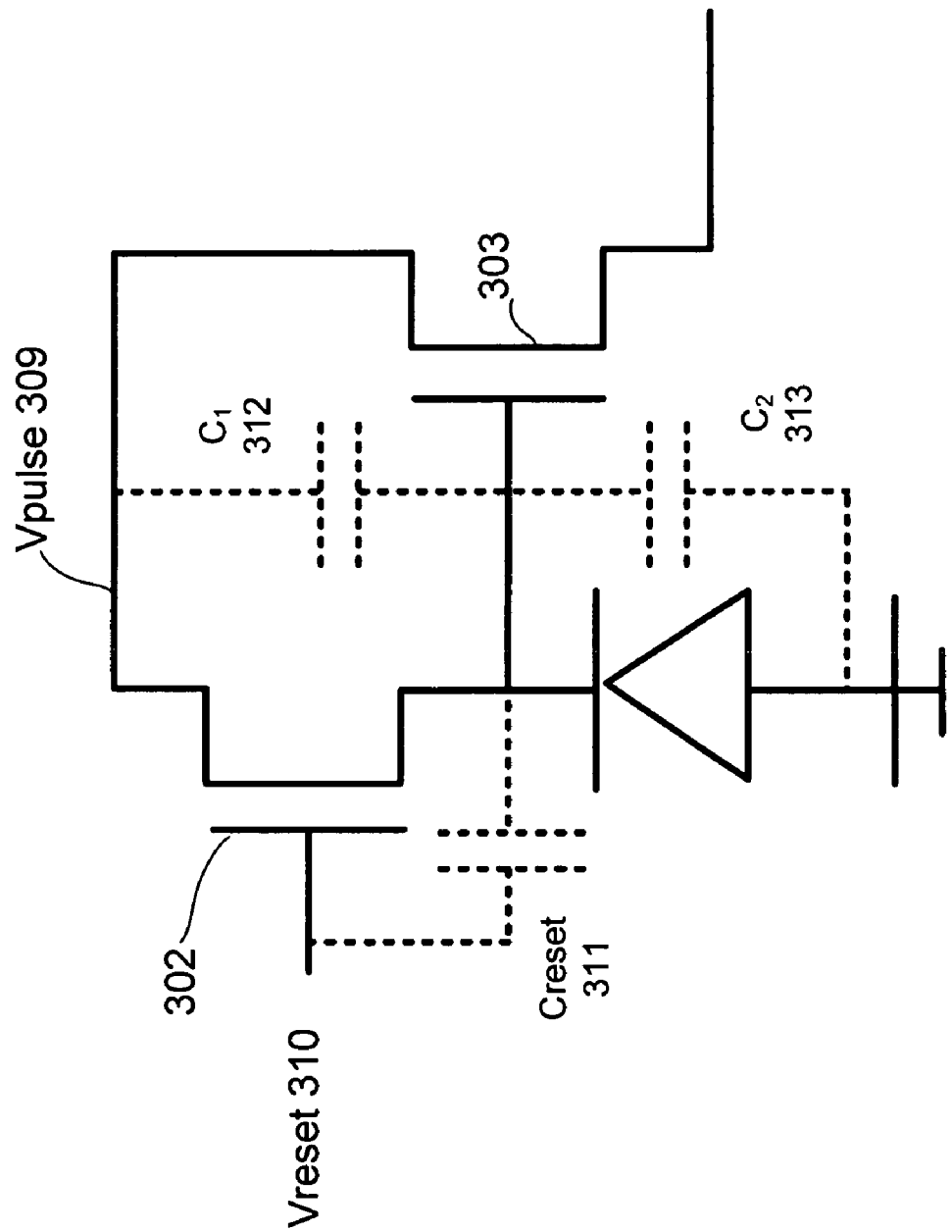
FIG. 3B illustrates one embodiment of parasitic capacitive coupling which results in an increased signal swing in the hard reset mode.

FIG. 3B illustrates parasitic capacitive coupling which results in an increased signal swing in the hard reset mode. The parasitic capacitive coupling between the drain and the gate of the first source follower transistor 303 leads to an increase in the dynamic range of the pixel. In the hard reset mode, Vpulse is pulsed high at the controllable high voltage supply node 309 right after the hard reset, causing the node at the cathode terminal of the photodiode 301 to increase, partially or fully compensating for the loss due to the capacitive reset coupling between the gate and source of the reset transistor 302.

In this embodiment, the capacitance Creset 311 represents the gate-source capacitance of the reset transistor 310. The capacitance C1 312 represents the gate-drain capacitance of the first source follower transistor 303 plus the drain-source capacitance of reset transistor 302. The capacitance C2 313 represents the photodiode capacitance. In one embodiment, the voltage at the cathode terminal of the photodiode 301 may increase after reset according to the following formula:

$$\Delta V = \Delta V pulse \cdot \frac{C1}{C1 + C2 + Creset} \quad (1)$$

where ΔVpulse is the increase in Vpulse 309 from a low value to the intermediate value (for example ΔVpulse=(Vpulse2−Vpulse1) of FIG. 4B) rather than from the lowest value to the highest value. This may be especially useful for photodiode 301 capacitances less than approximately 5 femto farads, which otherwise suffer from low swing due to the capacitive coupling with the reset pulse. As such, since the parasitic capacitance of the pixel is increased by coupling the drains of the reset transistor 302 and the first source follower transistor M1 303, the voltage swing of the pixel may be greater than a pixel having the drains coupled to a regular high voltage supply node, such as in FIG. 1B.

During readout of the pixel 350, the pixel structure 350 functions similarly to the structure in FIG. 1B because Vpulse 309, like Vmem, is pulsed high during reset and readout, and low during sampling, as described below.

Figure 3C:
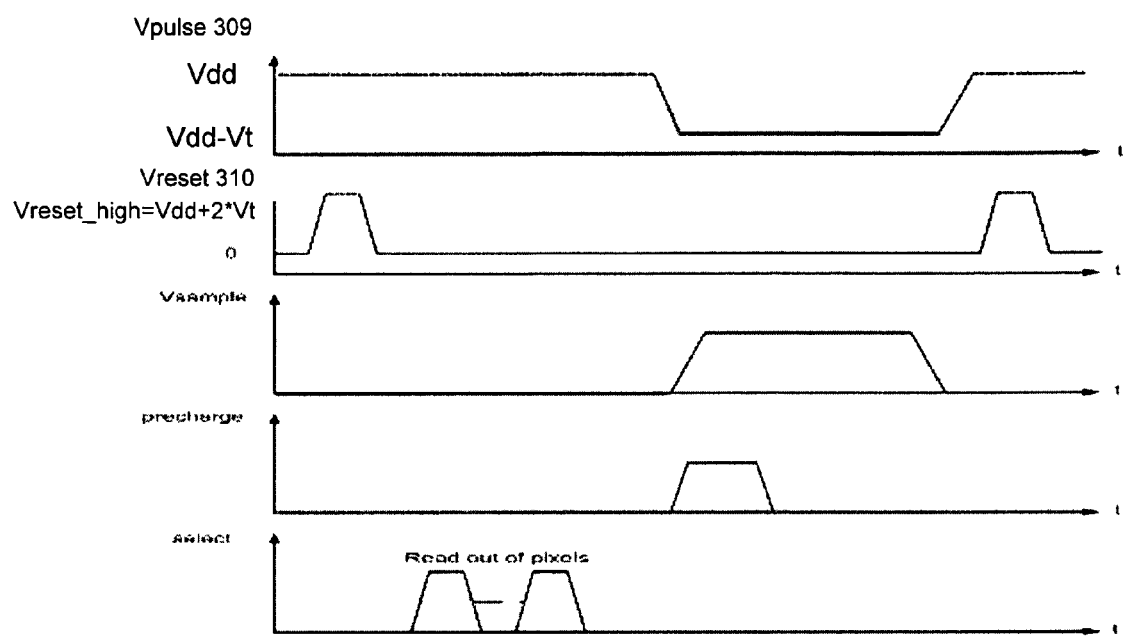
FIG. 3C illustrates a timing diagram of the 6T pixel structure of FIG. 3A according to one embodiment.

FIG. 3C illustrates a timing diagram of the 6T pixel structure of FIG. 3A according to one embodiment. This timing may be used in the 6T pixel where a transistor is not used for the memory capacitor 308. For a hard reset, the Vreset signal may be 2Vt higher than VDD. For a soft reset, the Vreset signal may be on the same order of magnitude as VDD. However, the advantage of increased signal swing may not be present because Vpulse 309 must be pulsed high before the reset signal comes up.

Figure 2:
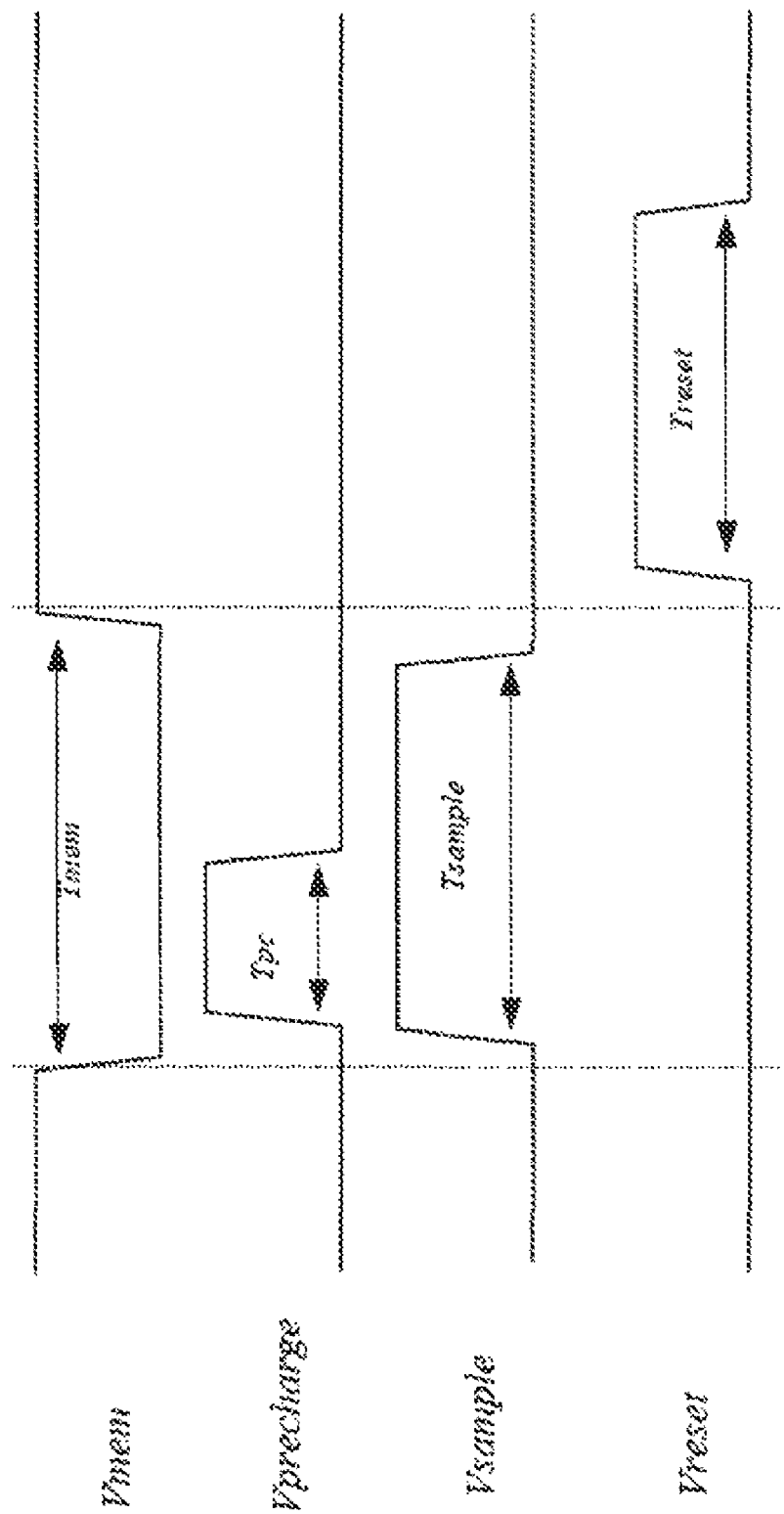
FIG. 2 illustrates a timing diagram of the 6T pixel structure of FIG. 1B.

In another embodiment, the pixel 350 operates according to the timing diagram of FIG. 2.

It should be noted that the embodiments described with respect to FIGS. 3A-3C are directed to a pixel having a memory capacitor that is not a MOS transistor, while the embodiments of FIGS. 4A-4D are directed to a pixel having a MOS transistor for the memory capacitor.

Figure 4A:
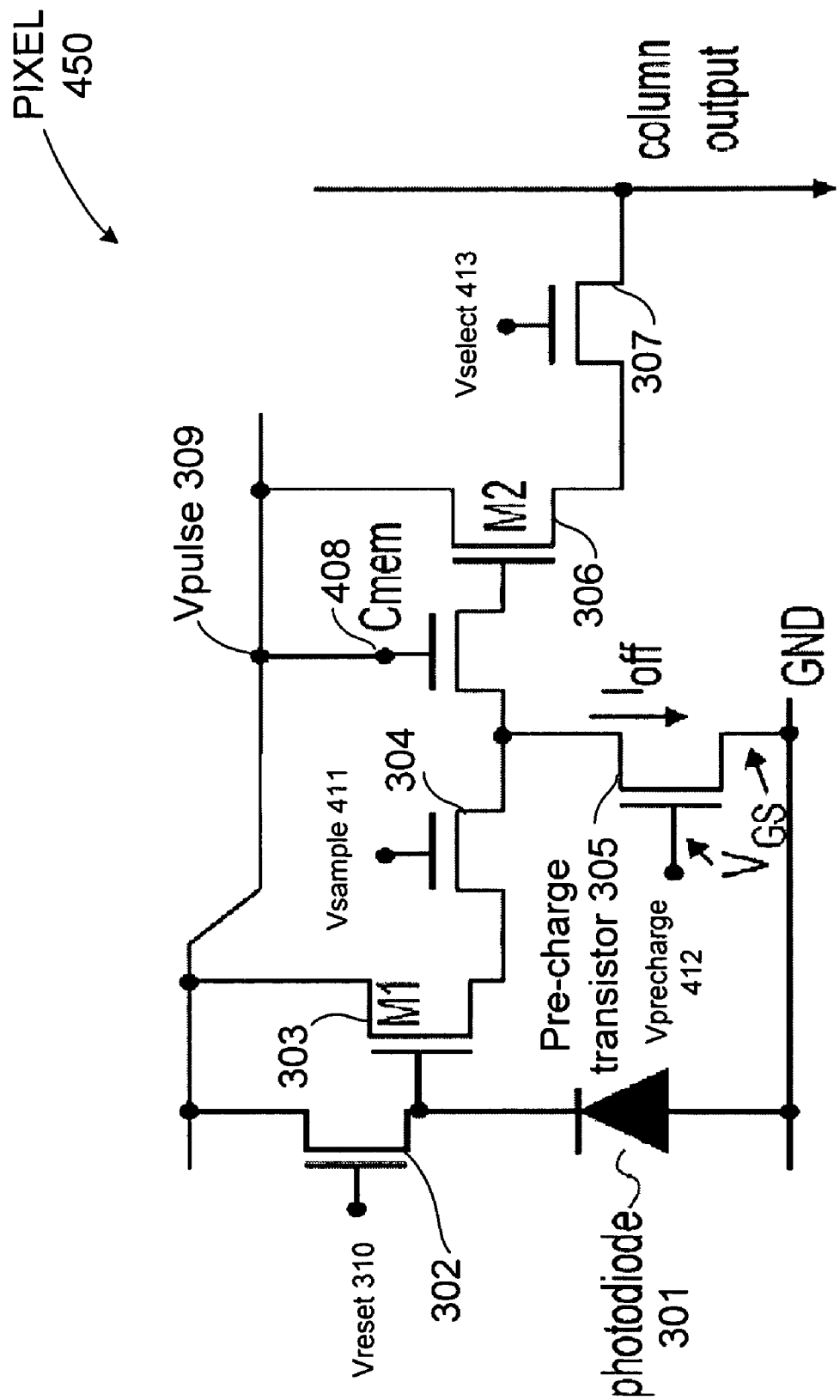
FIG. 4A illustrates an alternative embodiment of a pixel having a controllable high voltage supply node for the pixel coupled to the memory capacitor where the memory capacitor is a MOS transistor.
Figure 4B:
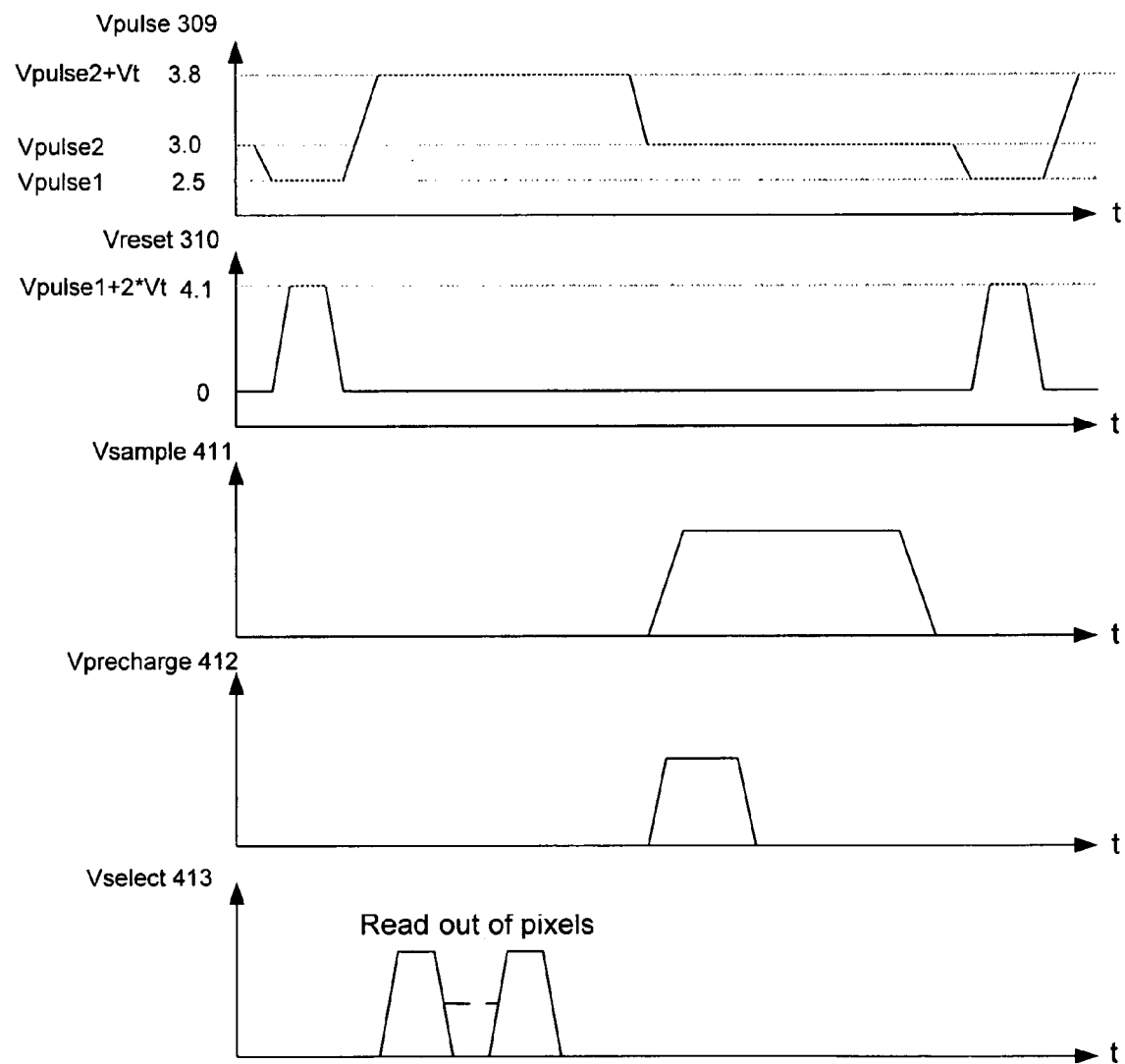
FIG. 4B illustrates the timing for one embodiment of a hard reset operation with the 6T pixel structure of FIG. 4A.
Figure 4C:
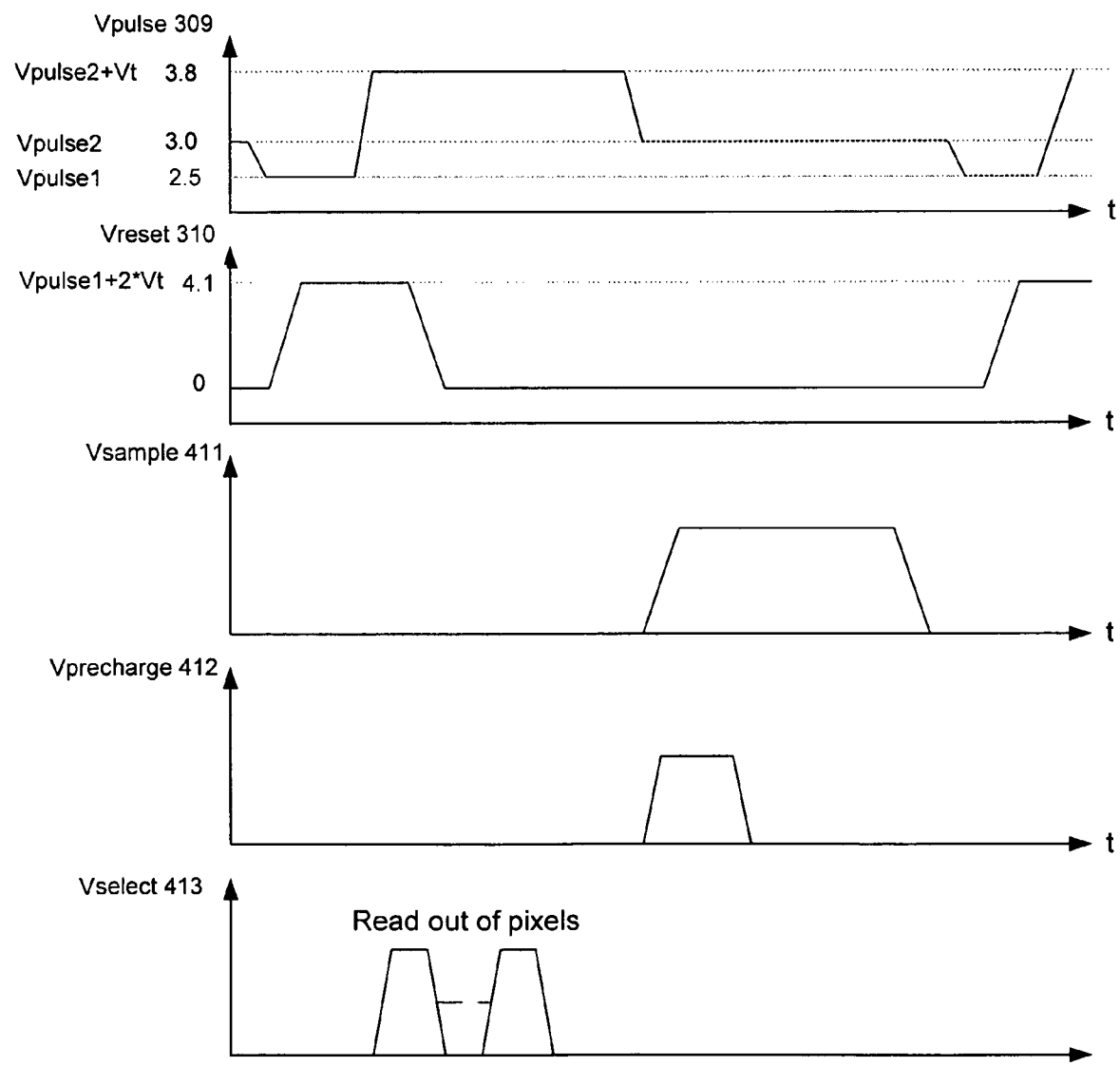
FIG. 4C illustrates the timing for one embodiment of a hard-soft reset operation with the 6T pixel structure of FIG. 4A.

FIG. 4A illustrates an alternative embodiment of a pixel having a controllable high voltage supply node for the pixel coupled to the memory capacitor where the memory capacitor 408 is a MOS transistor. In this embodiment, the controllable high voltage supply node 309 is coupled with a gate terminal of the MOS memory capacitor 408. When a transistor is used for the memory capacitor 408, such a pixel structure requires a timing change compared to the traditional timing in hard reset mode or in hard-soft reset mode as described below.

Advantages of the pixel structure of FIG. 4A include one or more of the following: increased fill factor, yield, and signal swing compared to conventional 6T pixel. More specifically, the pixel fill factor is increased due to the use of one less conductive interconnection line in the pixel. Yield may be improved because a short already intentionally exists between VDD and Vpulse, so voltages and timing are chosen in such a way that this does not give a bad pixel response. The signal swing is also increased, especially with a small photodiode capacitance of less than approximately 5 femto farads.

When a transistor is used as the memory capacitor, proper biasing is required to form a channel in the transistor during sampling and readout. For this reason, it is required to have a timing change in the hard rest mode and the hard-soft reset mode compared to the conventional timing. In hard reset operation, the voltage on the drain terminal of the reset transistor needs to be at about 2 Vts lower than the reset voltage. During sampling, the voltage on the diffusion of the memory transistor will then be a maximum of one Vt lower (from the first source follower transistor) than the photodiode voltage, which is the same as the Vpulse voltage during reset. Therefore, the Vpulse must be pulsed to an intermediate voltage before sampling (to ensure there is a channel in the memory transistor). In one embodiment, this Vpulse increase is right after reset, as this may increase signal swing due to the parasitic drain-gate capacitance of the first source follower 303. After sampling and before readout, the Vpulse must be pulsed to a third and highest voltage to overcome the loss of the Vt from the second source follower transistor 306.

A hard reset operation as illustrated in FIG. 4B or a hard-soft reset mode illustrated in FIG. 4C requires triple Vpulse timing when the Cmem is a MOS transistor. In such an embodiment where the memory capacitor is a MOS transistor, Vpulse 309 is pulsed between three voltages in the hard reset and hard-soft reset mode. During a reset, when the Vreset signal 310 is high, Vpulse 309 is pulsed low to ensure a hard reset, for example, as illustrated by the first Vpulse signal transition from 3V to 2.5V in FIGS. 4B and 4C. During readout, when the Vselect signal 413 is high, Vpulse 309 must be pulsed high, for example, as illustrated by the second Vpulse signal transition from 2.5V to 3.8V. During sampling, when the Vsample signal 411 is high, Vpulse 309 is pulsed to an intermediate voltage to ensure channel formation, for example, as illustrated by the third Vpulse signal transition from 3.8 V to 3 V.

More specifically, in the hard reset operation, the voltage on the drain of the reset transistor needs to be at about 2 Vt's lower than the reset voltage. In one embodiment, the Vt ranges between approximately 0.4 volts to 0.8 volts. Alternatively, the Vt may be other voltages based on the type of processing, and the type and design of the transistors. During sampling, the voltage on the diffusion of the memory transistor will then be a maximum of one Vt lower (from the first source follower M1) than the photodiode voltage which is the same as the Vpulse voltage during reset. Therefore, the Vpulse 309 is pulsed to an intermediate value before sampling (to ensure there is a channel in the memory transistor). In one embodiment, this Vpulse increase is right after reset. This may increase signal swing due to the parasitic drain-gate capacitance of the first source follower describe above. Alternatively, the Vpulse increase may be later. After sampling and before readout the Vpulse is pulsed to a third and highest voltage to overcome the loss of the (M2) second source follower's Vt.

In one embodiment, Vpulse 309 represents the controllable high voltage supply signal applied to the drain terminals of transistors 302, 303, 306 and the gate terminal of Cmem transistor 408. The voltage Vreset 310 represents the reset signal applied to the gate terminal of reset transistor 302. The voltage Vsample 411 represents the signal applied to the gate terminal of sample transistor 304. The voltage Vprecharge 412 represents the signal applied to the gate terminal of precharge transistor 305. The precharge signal may be used during the beginning of the sampling period to erase the previous sampled value. The voltage Vselect 413 represents the signal applied to the gate terminal of row select transistor 307.

Figure 4D:
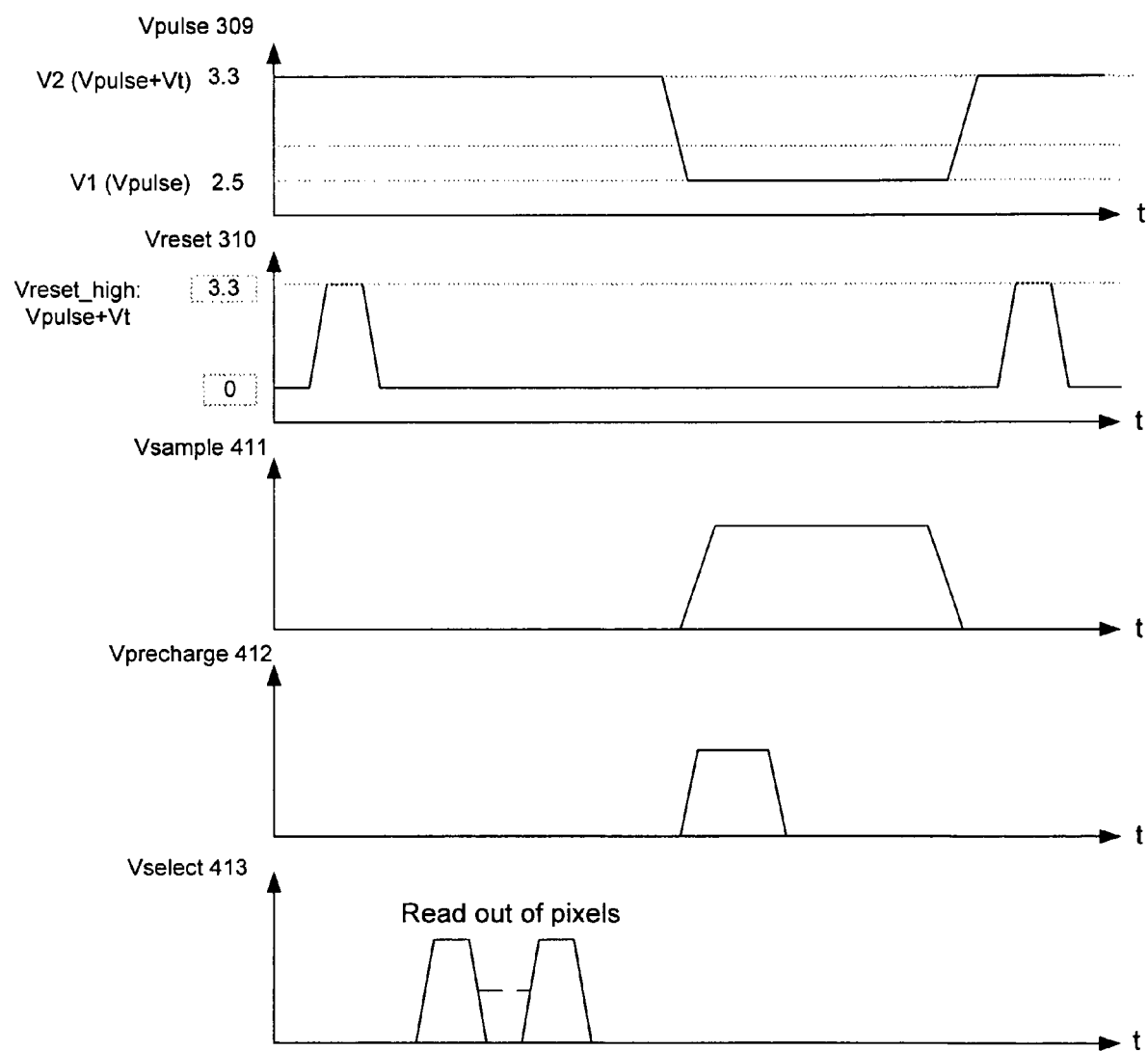
FIG. 4D illustrates the timing for one embodiment of a soft reset operation with the 6T pixel structure of FIG. 4A.

FIG. 4D illustrates the timing for one embodiment of a soft reset operation with the 6T pixel structure of FIG. 4A. In soft reset, the photodiode reset voltage is determined by the reset high gate voltage. In one embodiment, VDD may be equal to 2.5 volts and Vt may equal 0.7 volts. Alternatively, the supply voltage VDD and Vt may be other values. In soft reset, the drain voltage on the reset transistor (Vpulse 309) must be on the same order as the reset gate voltage during reset. As such, as seen in FIG. 4B, while the Vreset 310 remains high, Vpulse 309 transitions from the low Vpulse (e.g., Vpulse1) to the high Vpulse (e.g., Vpulse2+Vt).

Figure 5:
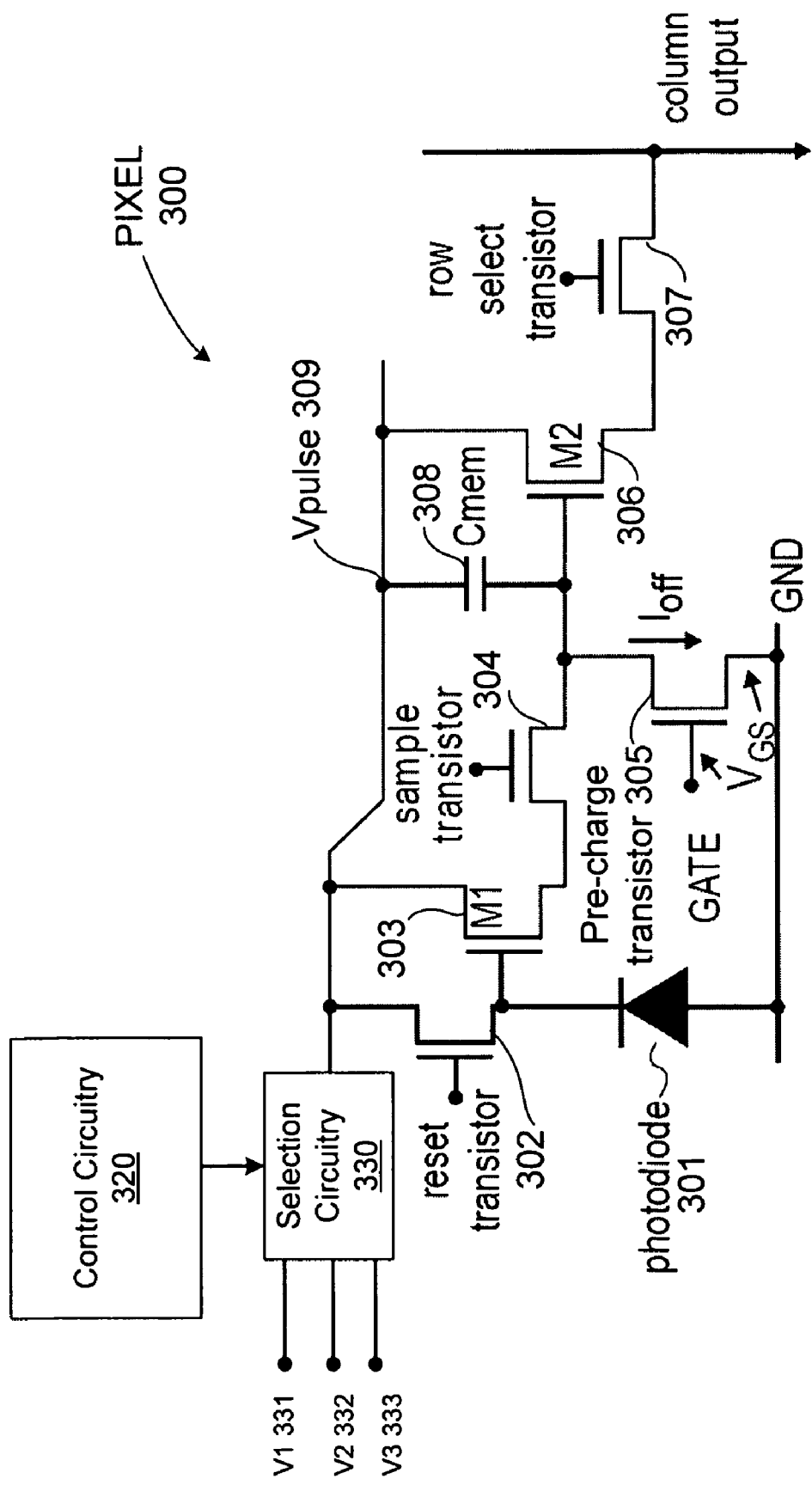
FIG. 5 illustrates the 6T pixel structure of FIG. 3A implemented in a system with circuitry to control the Vpulse voltage level.

FIG. 5 illustrates the 6T pixel structure of FIG. 3A implemented in a system with circuitry to control the Vpulse voltage level. In one embodiment, Vpulse 309 may be one of three different voltages; V1 331, V2 332, and V3 333. The three voltages are received by selection circuitry 330. Selection circuitry may be a multiplexer circuit capable of selecting one of the three voltages to supply to the pixel circuit 300 as Vpulse 309. Control circuitry 320 may be used to control the operation of selection circuitry 330. In one embodiment, control circuitry 320 may direct selection circuitry 330 to make Vpulse 309 high during the pixel readout phase of operation, low during pixel reset and an intermediate voltage level during sampling.

Figure 6:
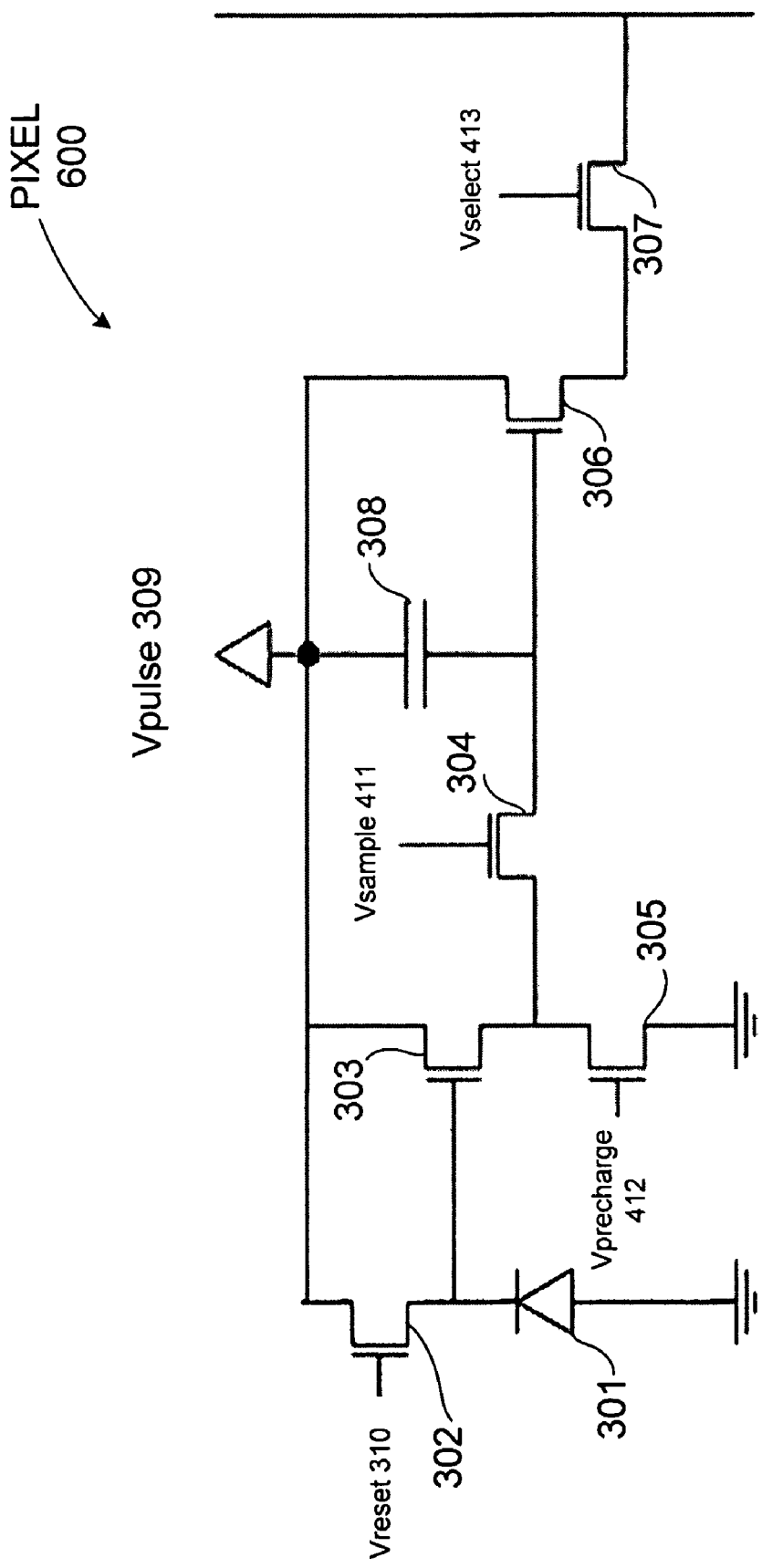
FIG. 6 illustrates an alternative embodiment of a pixel having a controllable high voltage supply node coupled to the memory capacitor in the pixel.

FIG. 6 illustrates an alternative embodiment of a pixel structure having the precharge transistor 305 coupled to the drain of the sample transistor 304, as opposed to its position in FIG. 3A where the precharge transistor 305 is coupled directly to the Cmem capacitor 308.

Figure 7:
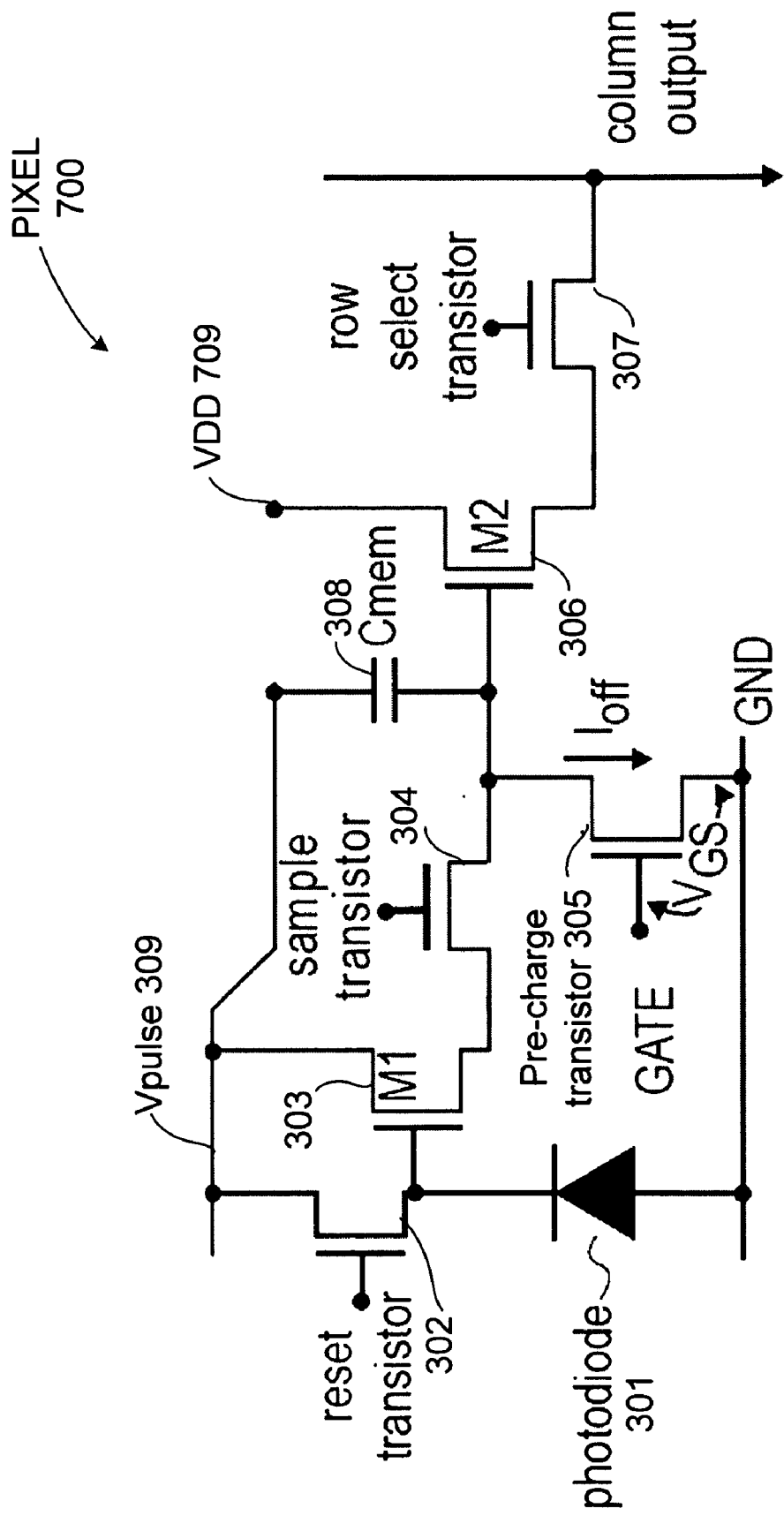
FIG. 7 illustrates an alternative embodiment of a pixel having a controllable high voltage supply node coupled to the memory capacitor and the first source follower transistor and a regular high voltage supply node coupled to the second source follower transistor.

FIG. 7 illustrates an alternative embodiment of a pixel 700 having a controllable high voltage supply node 309 coupled to the memory capacitor 308 and the first source follower transistor 303 and a regular high voltage supply node 709 coupled to the second source follower transistor 306. This structure may lose the advantage of increased fill factor, but still retains a partial advantage in increased yield and dynamic range.

Figure 8:
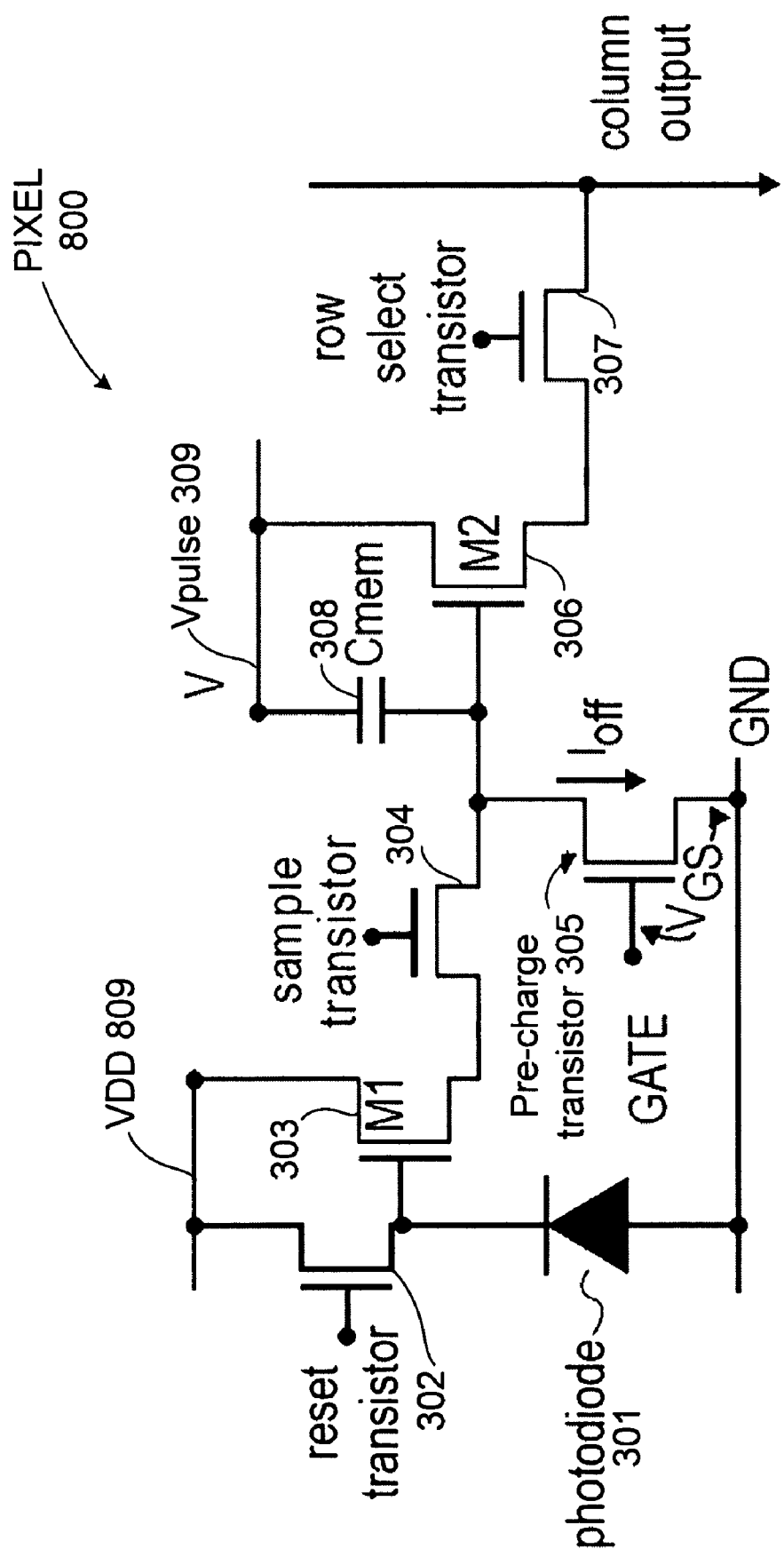
FIG. 8 illustrates an alternative embodiment of a pixel having a controllable high voltage supply node coupled to the memory capacitor and the second source follower transistor and a regular high voltage supply node coupled to the first source follower transistor.

FIG. 8 illustrates an alternative embodiment of a pixel 800 having a controllable high voltage supply node 309 coupled to the memory capacitor 308 and the second source follower transistor 306 and a regular high voltage supply node 809 coupled to the first source follower transistor 303.

Embodiments of the present have been illustrated with MOS technology for ease of discussion. In alternative embodiments, other device types and process technologies may be used, for example, BiCMOS. It should be noted that the circuits described herein may be designed utilizing various voltages.

The pixel structures discussed herein may be with image sensors for various applications including, but not limited to, a digital camera system, for example, for general-purpose photography (e.g., camera phone, still camera, video camera) or special-purpose photography (e.g., in automotive systems, hyperspectral imaging in space borne systems, etc). Alternatively, the image sensor and pixel structures discussed herein may be used in other types of applications, for example, machine and robotic vision, document scanning, microscopy, security, biometry, etc. In one particular embodiment, the pixel structures discussed herein may be used in applications requiring a snapshot with low PLS. In another embodiment, an imaging system having a mechanical shutter may be replaced with an electric shutter using the pixel structures described herein where low PLS may be needed.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A pixel, comprising:
   a controllable high voltage supply node;
   a reset transistor and a first source follower transistor each having a drain electrode; and
   a memory capacitor having a first plate coupled to the controllable high voltage supply node and to the drain of one of the reset transistor and the first source follower transistor.

2. The pixel of claim 1, further comprising:
   a selection circuit coupled to the controllable high voltage supply node and a plurality of different, voltages; and
   a control circuit coupled to the selection circuit to select one of the plurality of different voltages for the controllable high voltage supply node.

3. The pixel of claim 1, further comprising:
   a second source follower transistor having a drain coupled to the controllable high voltage supply node.

4. The pixel of claim 1, wherein the pixel is a six transistor pixel.

5. The pixel of claim 4, wherein the six transistor pixel comprises:
   the reset transistor having a source coupled to a photosensitive element;
   the first source follower transistor having a gate coupled to the photosensitive element;
   a second source follower transistor having a drain coupled to the controllable high voltage supply node and a gate coupled to an other plate of the memory capacitor;
   a precharge transistor having a source coupled to ground and a drain coupled to at least one of a source of the first source follower transistor and a gate of the second source follower transistor;
   a sample transistor coupled between the source of the first source follower transistor and the other plate of the memory capacitor; and
   a select transistor coupled to a source of the second source follower transistor and an output signal line.

6. The pixel of claim 1, wherein the memory capacitor comprises a metal-oxide-semiconductor (MOS) transistor.

7. The pixel of claim 6, wherein the gate of the MOS transistor is coupled to the controllable high voltage supply node.

8. The pixel of claim 7, wherein the pixel is a six transistor pixel comprising:
   the reset transistor having a source coupled to a photosensitive element;
   the first source follower transistor having a gate coupled to the photosensitive element;
   a second source follower transistor having a drain coupled to the controllable high voltage supply node and a gate coupled to a non-gate terminal of the MOS transistor;
   a precharge transistor having a source coupled to ground and a drain coupled to a source of the first source follower transistor;
   a sample transistor coupled between the source of the first source follower transistor and the other non-gate terminal of the MOS transistor; and
   a select transistor coupled to a source of the second source follower transistor and an output signal line.

9. A method of operating a pixel, having a controllable high voltage supply node coupled to a memory capacitor, comprising:

coupling one of a reset transistor and a first source follower transistor to the controllable high voltage supply node;

placing the pixel in either a hard reset mode or a hard-soft reset mode; and pulsing a plurality of different voltages on the controllable high voltage supply node coupled to the memory capacitor.

10. The method of claim 9, wherein pulsing the plurality of different voltage comprises:

applying a high voltage pulse on the memory capacitor during a reset of a pixel and during readout of the pixel; and applying a low voltage pulse on the memory capacitor during sampling of the pixel.

11. The method of claim 9, wherein the memory capacitor comprises a metal-oxide-semiconductor (MOS) transistor, and wherein pulsing the plurality of different voltage comprises pulsing three different voltages on the controllable high voltage supply node coupled to the memory capacitor.

12. The method of claim 11, wherein pulsing the three different voltage comprises:

applying a low voltage pulse on the memory capacitor during a reset of the pixel;

applying a high voltage pulse on the memory capacitor during readout of the pixel; and applying an intermediate voltage pulse on the memory capacitor during sampling of the pixel.

13. The method of claim 11, wherein pulsing the three different voltage comprises:

applying a low voltage pulse on the memory capacitor during a hard reset of the pixel;

applying a high voltage pulse on the memory capacitor during a soft reset of the pixel after the hard reset;

applying the high voltage pulse on the memory capacitor during readout of the pixel; and applying an intermediate voltage pulse on the memory capacitor during sampling of the pixel.

14. The method of claim 13, wherein the low voltage pulse is lower than a reset voltage by two times a threshold voltage of a reset transistor of the pixel, wherein the intermediate voltage pulse is greater than the low voltage by at least a threshold voltage of a first source follower transistor of the pixel, and wherein the high voltage pulse is greater than the intermediate voltage pulse by a threshold voltage of a second source follower transistor of the pixel.

15. The method of claim 11, further comprising biasing the MOS transistor to form a channel in the MOS transistor during sampling and readout of the pixel.

16. An apparatus, comprising:

a pixel having a plurality of transistors and a memory capacitor;

means for coupling drains of the plurality of transistors and the memory capacitor to a high voltage supply node; and means for controlling the high voltage supply node to transition between a plurality of voltage levels.

17. The apparatus of claim 16, wherein the means for controlling increases a voltage swing of: the pixel.

18. The apparatus of claim 16, wherein the means for coupling increases a fill factor of the pixel, and wherein the fill factor is a measure of a ratio of the light sensitive area of the pixel to the total area of the pixel.

19. The apparatus of claim 16, wherein the means for coupling reduces a number of different voltage lines that can be shorted together during manufacturing of the apparatus.

20. The apparatus of claim 16, wherein the pixel further comprises a photosensitive element, and wherein the plurality of transistors comprises a reset transistor coupled to the photosensitive element at a source of the reset transistor, and a source follower transistor coupled to the photosensitive element at a gate of the source follower transistor, and wherein the means for coupling increases parasitic capacitive coupling between the drain and gate of the source follower transistor to compensate for parasitic capacitive coupling between a gate and the source of the reset transistor.

* * * * *